(12) United States Patent
Iwamaru (10) Patent No.: US 7,281,491 B2
(45) Date of Patent: Oct. 16, 2007

(54) DIELECTRIC-COATED ELECTRODE, PLASMA DISCHARGE TREATMENT APPARATUS AND METHOD FOR FORMING THIN FILM

(75) Inventor: Shunichi Iwamaru, Hino (JP)

(73) Assignee: Konica Corporation (JP)

(*) Notice: Subject to any disclaimer, the term of this patent is extended or adjusted under 35 U.S.C. 154(b) by 761 days.

(21) Appl. No.: 10/456,650

(22) Filed: Jun. 5, 2003

(65) Prior Publication Data

US 2003/0228416 A1 Dec. 11, 2003

(30) Foreign Application Priority Data

Jun. 11, 2002 (JP) .............................. 2002-170028

(51) Int. Cl.
C23C 16/00 (2006.01)
C23F 1/00 (2006.01)
H01L 21/306 (2006.01)

(52) U.S. Cl. .................... 118/723 E; 156/345.43; 156/345.45; 156/914; 361/234

(58) Field of Classification Search ................ 156/345.43–345.47, 914; 361/234; 118/723 E
See application file for complete search history.

(56) References Cited

U.S. PATENT DOCUMENTS 5,463,526 A * 10/1995 Mundt ........................ 361/234
5,560,780 A * 10/1996 Wu et al. .................... 118/728
5,607,541 A * 3/1997 Kubota et al. ............... 156/538
6,106,659 A * 8/2000 Spence et al. ........... 156/345.43

FOREIGN PATENT DOCUMENTS

| JP | 02-227424 | 9/1990 |
| JP | 02-276842 | 11/1990 |
| JP | 03-014882 | 1/1991 |
| JP | 03-122137 | 5/1991 |
| JP | 11-061406 | 3/1999 |
| JP | 11-133205 | 5/1999 |
| JP | 11-191500 | 7/1999 |
| JP | 2000-121804 | 4/2000 |
| JP | 2000-122038 | 4/2000 |
| JP | 2000-147209 | 5/2000 |
| JP | 2000-185362 | 7/2000 |
| JP | 2000-301655 | 10/2000 |

* cited by examiner

*Primary Examiner*—Karla Moore
(74) *Attorney, Agent, or Firm*—Cantor Colburn LLP (57) ABSTRACT

A dielectric-coated electrode having a conductive base material coated with a dielectric on a surface thereof, the dielectric including a first metal atom and a second metal atom. As for an ionic strength of the first metal atom and an ionic strength of the second metal atom according to a dynamic SIMS measurement, the ionic strength of the second metal atom is larger than the ionic strength of the first metal atom from the most surface of the dielectric toward a predetermined depth of the dielectric, and the ionic strength of the first metal atom is larger than the ionic strength of the second metal atom from the predetermined depth toward the surface of the conductive base material.

34 Claims, 5 Drawing Sheets

FIG. 8

DIELECTRIC-COATED ELECTRODE, PLASMA DISCHARGE TREATMENT APPARATUS AND METHOD FOR FORMING THIN FILM

BACKGROUND OF THE INVENTION

1. Field of the Invention

The present invention relates to a dielectric-coated electrode such that the surface of a conductive base material is coated with a dielectric, to a plasma discharge treatment apparatus comprising the dielectric-coated electrode, and a to method for forming a thin film by using the dielectric-coated electrode.

2. Description of Related Art

Recently, various high-functional films such as conductive films, antireflection films, antistatic films and the like have been used for liquid crystal display elements, semiconductor elements, optical elements and the like. As for a method for forming these high-functional films, a method for forming a thin film on a surface of a substrate or the like disposed between electrodes by discharging under atmospheric pressure or under a pressure in the vicinity of atmospheric pressure and performing plasma excitation of a reactive gas (atmospheric pressure plasma method) is disclosed in the Japanese Patent Laid-Open Publications Nos. 11-133205, 2000-185362, 11-61406, 2000-147209, 2000-121804 and the like.

The atmospheric pressure plasma method disclosed in these Publications is for generating discharge plasma between facing electrodes by applying a voltage having a frequency of 0.5 to 100 kHz so that the electric field strength will become from 1 to 100 V/cm.

Incidentally, as for the electrodes used in such an atmospheric pressure plasma method, the surface of the electrodes is required to be coated with a dielectric in order to obtain stable glow discharge under atmospheric pressure. There is no limitation in this dielectric unless it has a desired dielectric constant. However, a rubber, ceramic, glass and the like are generally known.

A technique for using a dielectric-coated electrode such that an alumina, which is a ceramic, is sprayed on a metal base material in an atmospheric pressure plasma treatment apparatus is suggested in the Japanese Patent Laid-Open Publication No. 11-191500. Such a dielectric-coated electrode has high durability rather than an electrode simply having a dielectric of rubber or glass. Such an electrode has no problem in so-called "surface treatment" such as changing a surface property such as wettability, adhesiveness or the like of the surface of a substrate, removing dirt on the surface of a substrate, or the like.

However, when the present inventor has studied the case of forming a high performance thin film in a large area, it is realized that it is required to apply a high-frequency voltage having higher frequency and larger electric power compared with the above-described surface treatment and that the durability of the above-described dielectric-coated electrode to which only an alumina is sprayed is insufficient. Concretely, it is recognized that a high-frequency voltage having a frequency over 100 kHz and electric power of not less than 100 W/cm² is required to be applied between facing dielectric-coated electrodes in an atmospheric pressure plasma treatment apparatus. Therefore, an electrode having high durability, which is durable in applying such a voltage of high power, has been studied earnestly. As a result, a dielectric-coated electrode capable of maintaining a discharged state which is stable for a long term even though a voltage of high power is applied has been found.

SUMMARY OF THE INVENTION

An object of the present invention is to provide a dielectric-coated electrode which can maintain a stable discharged state for a long term even though high power is applied, a plasma discharge treatment apparatus comprising the above-described dielectric-coated electrode, and a method for forming a thin film by using the above-described dielectric-coated electrode.

In order to achieve the above-described object, according to a first aspect of the present invention, the dielectric-coated electrode of the present invention comprises a conductive base material coated with a dielectric on a surface thereof, the dielectric comprising: a first metal atom and a second metal atom, wherein as for an ionic strength of the first metal atom and an ionic strength of the second metal atom according to a dynamic SIMS measurement, the ionic strength of the second metal atom is larger than the ionic strength of the first metal atom from the most surface of the dielectric toward a predetermined depth of the dielectric, and the ionic strength of the first metal atom is larger than the ionic strength of the second metal atom from the predetermined depth of the dielectric toward the surface of the conductive base material.

In the dielectric-coated electrode of the present invention, preferably, the predetermined depth is not less than 1 μm. In this case, the ionic strength of the second metal atom to the ionic strength of the first metal atom is preferable to decrease from the most surface of the dielectric toward the predetermined depth of the dielectric. Further, preferably, the first metal atom is Al, and the second metal atom is Si.

Further, the electrode is preferable to be obtained by spraying a material containing the first metal atom onto the base material, and thereafter, sealing the material containing the first metal atom with a material containing the second metal atom. In this case, preferably, the material containing the first metal atom is alumina, and the sealing is preferably for applying the material containing the second metal atom to the surface of the sprayed electrode, and hardening the material containing the second metal atom according to sol-gel reaction. Further, preferably, the hardened material containing the second metal atom is silicon oxide.

Moreover, a void fraction of the dielectric is preferable to be not more than 10 volume %, and a difference of a linear thermal expansion coefficient between the dielectric and the base material is preferable to be not more than $10 \times 10^{-6}/°C$. Furthermore, preferably, a heat-resistant temperature of the electrode is not less than 100° C.

Further, according to a second aspect of the present invention, the plasma discharge treatment apparatus of the present invention comprises: facing electrodes; a gas supply member for supplying a reactive gas between the facing electrodes; and a power source for applying a high-frequency voltage between the facing electrodes, wherein at least one of, preferably each of, the facing electrodes is the electrode in the above-described first aspect of the present invention.

Moreover, according to a third aspect of the present invention, the method for forming a thin film of the present invention comprises: supplying a reactive gas between facing electrodes; applying a high-frequency voltage between the facing electrodes under atmospheric pressure or under a pressure in a vicinity of the atmospheric pressure and discharging so as to make the reactive gas in a plasma state;

and supplying a substrate between the facing electrodes and exposing the substrate to the reactive gas in the plasma state so as to form the thin film on a surface of the substrate, wherein at least one of, preferably each of, the facing electrodes is the electrode in the above-described first aspect of the present invention.

BRIEF DESCRIPTION OF THE DRAWINGS

The present invention will become more fully understood from the detailed description given hereinbelow and the appended drawings which given by way of illustration only, and thus are not intended as a definition of the limits of the present invention, and wherein.

PREFERRED EMBODIMENT OF THE INVENTION

Hereinafter, an embodiment of the present invention will be explained.

The dielectric-coated electrode of the present invention is preferable to be produced by spraying a material having a first metal atom as a principal component on a surface of a conductive base material, such as metal or the like, and coating a dielectric, and thereafter, by sealing a sealer having a second metal atom as a principal component on the surface of the dielectric.

In this case, as for the ionic strength of the first metal atom and the ionic strength of the second metal atom according to the dynamic SIMS measurement, the ionic strength of the second metal atom is larger than the ionic strength of the first metal atom from the most surface to a predetermined depth of the dielectric, and the ionic strength of the first metal atom is larger than the ionic strength of the second metal atom from the above-described predetermined depth to the surface of the conductive base material.

Further, the ionic strength of the second metal atom corresponding to the ionic strength of the first metal atom is preferable to decrease from the most surface to the predetermined depth of the dielectric. "To decrease" means that the ion concentration is lower in the predetermined depth compared with the most surface of the dielectric.

The concentration curve from the most surface to the predetermined depth is preferable to be continuous. This is only to exclude the case such that a layer having the first metal atom as a principal component and a layer having the second metal atom as a principal component exist separately (discontinuous case). The concentration curve may decrease monotonically at a constant concentration change, or it may be continuously negative even though the concentration change is not constant.

This is caused by forming an electrode so that a material containing the second metal atom may penetrate from the surface of the sprayed film of a material containing the first metal atom on the base material of the electrode, in production of the electrode of the present invention. The detail is unknown, however, it is presumed that the durability of the whole electrode is improved by controlling the composition from the most surface of such a dielectric.

In addition, the predetermined depth is preferable to be not less than 1 μm.

Thus, it is presumed that the ionic strength of the second metal atom is made to be large from the most surface to a predetermined depth of the dielectric, and the ionic strength of the first metal atom is made to be large from the above-described predetermined depth to the surface of the conductive base material, and thereby that the voids formed in the most surface of the dielectric is filled up with the second metal atom so as to become a precise film.

On the other hand, in the vicinity of the surface of the base material, it is considered that there is little penetration of the second metal atom and there exists appropriate voids, and therefore that the difference in expansion between the base material and the dielectric according to temperature increase may be absorbed. Therefore, for example, in case of applying a high-frequency voltage over 100 kHz and large electric power of not less than 1 $W/cm^2$ between facing electrodes, generally, dielectric breakdown occurs from the surface of the electrodes. However, the dielectric breakdown can be prevented by making ionic strength of the second metal atom large to the predetermined depth as described above so as to make a precise film. Thereby, it becomes possible to maintain a discharged state for a long term.

Here, the dynamic SIMS (Dynamic Secondary Ion Mass Spectrometry) measurement is a method for irradiating ions such as $O_2$, Cs, Ar, Xe and the like to a surface of a sample and detecting secondary ions emitted from the surface. Since this method is a method for measuring by scraping the sample while irradiating the ions continuously to the sample, it is possible to analyze the distribution state in the depth direction. In the later-described Examples, an ADEPT-1010 produced by Physical Electronics, Inc., US, was used.

In this dynamic SIMS measurement, there is a possibility that detectors and the like becomes saturated since the detected strength of the metal ions of the first metal atom is high. Therefore, measurement is performed by adjusting an FAP (Field Axis Potential) so as to lower the detected strength of the metal ions. Further, in case that there is a possibility such that detectors and the like becomes saturated since the detected strength of the metal ions of the second metal atom is high, measurement may be performed by adjusting the FAP so as to lower the detected strength of the metal ions.

Further, as for the dielectric-coated electrode of the present invention, it is the one such that at least the discharge surface on the conductive base material is coated with the dielectric. That is, in case of providing the electrode of the present invention in the later-described thin film forming apparatus (plasma discharge treatment apparatus), at least one of the facing application electrode and earth electrode is coated with a dielectric, and preferably, both of the application electrode and earth electrode are coated with a dielectric.

As for the dielectric used in the dielectric-coated electrode of the present invention, that is, the material containing the above-described first metal atom, concretely, it is preferable to be an inorganic compound having a dielectric constant between 6 and 45. Further, as such a dielectric, there are ceramics and the like such as alumina, silicon nitride and the like. In here, the one that ceramics is sprayed is preferable. Particularly, the one that alumina is sprayed is preferable.

As a method for spraying ceramics as a dielectric in high density and high adhesion to the above-described conductive base material, an atmospheric plasma spraying method is given. The atmospheric plasma spraying method is a technique of forming a film by putting impalpable powders of ceramics or the like, wires or the like into a plasma heat source and spraying them as fine particles in a molten or half-molten state to a conductive base material, which is an object to be coated.

The plasma heat source is a plasma gas of high temperature obtained by making the temperature of a molecular gas high so as to dissociate it into atom, and further providing energy so as to make it release electrons. Since the jet velocity of this plasma gas is large and the sprayed material collides with the conductive base material at high speed compared with electric arc spraying or flame spraying in earlier technology, its adhesion strength is high, and a high-density film can be obtained.

For details, a spraying method for forming a heat shield film on a high-temperature exposure member can be referred in the Japanese Patent Laid-Open Publication No. 2000-301655. According to this method, it is possible to make the void fraction of the dielectric to be coated (ceramic thermal-sprayed coating) not more than 10 volume %, and moreover, not more than 8 volume %.

As for sealing performed to the surface of the thermal-sprayed coating (dielectric) of ceramics or the like, which is coated in this manner, it is preferable to be performed with a material containing the second metal atom, that is, inorganic compound. As the inorganic compound, metal oxide is preferable. In here, particularly, the one containing silicon oxide ($SiO_x$) as a principal component is preferable. The void fraction of the dielectric can be reduced more by performing sealing.

Further, the inorganic compound for sealing is preferable to be formed by being hardened according to sol-gel reaction. In case that the inorganic compound for sealing is the one having metal oxide as a principal component, metalalkoxide or the like is applied as sealing solution onto the above-described ceramic thermal-sprayed coating, and is hardened according to sol-gel reaction. In case that the inorganic compound is the one having silica as a principal component, it is preferable to use alkoxysilane as sealing solution.

Here, in order to promote the sol-gel reaction, it is preferable to use energy treatment. As energy treatment, there are heat curing (preferably, not more than 200° C.), UV irradiation and the like. Moreover, as a method for sealing, when the sealing solution is diluted and coating and hardening are sequentially repeated several times, the inorganic compound becomes furthermore inorganic, and a precise electrode with no deterioration can be obtained.

In case of performing sealing by hardening according to sol-gel reaction after coating the metalalkoxide or the like of the dielectric-coated electrode of the present invention as sealing solution on a ceramic thermal-sprayed coating, the content of the metal oxide after hardening is preferable to be not less than 60 mol %. When alkoxysilane is used as metalalkoxide of sealing solution, the content of the $SiO_x$ (wherein x is not more than 2) after hardening is preferable to be not less than 60 mo %. The content of the $SiO_x$ after hardening is measured by analyzing the fault of the dielectric layer according to XPS.

In the dielectric-coated electrode, as a result that the inventors studied earnestly, it is found that the void fraction of the dielectric is not more than 10 volume %, preferably, not more than 8 volume %, as one of the approaches to an electrode durable to large electric power as mentioned above. Preferably, it is over 0 volume % to not more than 5 volume %. In addition, the void fraction of the dielectric means the void fraction having penetration in the thickness direction of the dielectric, and it can be measured by a mercury porosimeter. In the later-described Examples, the void fraction of the dielectric coated to the conductive base material was measured by a mercury porosimeter produced by Shimadzu Corporation.

When the dielectric has low void fraction, then high durability is achieved. As such a dielectric having low void fraction even though it has voids, a ceramic thermal-sprayed coating and the like of high density and high adhesion according to the later-described atmospheric plasma method or the like can be given.

Further, in the dielectric-coated electrode of the present invention, as another preferable approach to an electrode durable to large electric power, its heat-resistant temperature is not less than 100° C. More preferably, it is not less than 120° C., further preferably, not less than 150° C. In addition, the heat-resistant temperature is the temperature of the surface of the dielectric, that is, the surface of the face opposite from the conductive base material of the dielectric, which is durable in a state capable of being discharged normally without occurrence of dielectric breakdown.

Such a heat-resistant temperature can be achieved by applying a dielectric provided by the above-described ceramic spraying, or by appropriately combining means for appropriately selecting a material in a range within the difference of linear thermal expansion coefficient between the below-described conductive base material and the dielectric.

Further, in the dielectric-coated electrode of the present invention, as another preferable approach, there is a combination such that the difference between the linear thermal expansion coefficient of the dielectric and that of the conductive base material is not more than $10\times10^{-6}/°$ C. Preferably, the difference is not more than $8\times10^{-6}/°$ C., more preferably, not more than $5\times10^{-6}/°$ C., and further preferably, not more than $2\times10^{-6}/°$ C. In addition, the linear thermal expansion coefficient is a well-known physical property peculiar to a material.

Further, the linear thermal expansion coefficient of the dielectric means the linear thermal expansion coefficient of the whole dielectric, and is equal to the linear thermal expansion coefficient obtained by detaching the dielectric from the conductive base material and performing measurement to the whole dielectric.

As combinations of the conductive base material and the dielectric having the difference of linear thermal expansion coefficient within the above-mentioned range, there are:

(1) the conductive base material being pure titanium, and the dielectric being ceramics;

(2) the conductive base material being titanium alloy, and the dielectric being ceramics;

(3) the conductive base material being stainless, and the dielectric being ceramics;

(4) the conductive base material being a composite material of ceramics and iron, and the dielectric being ceramics; and (5) the conductive base material being a composite material of ceramics and aluminum, and the dielectric being ceramics; and the like.

From the viewpoint of difference of linear thermal expansion coefficient, the above-described (1), (2), (4) and (5) are preferable.

Further, in the dielectric-coated electrode of the present invention, as another preferable approach to an electrode durable to large electric power, the thickness of the dielectric is between 0.5 and 2 mm. The variation of this film thickness is desirable to be not more than 5%, preferably, not more than 3%, and further preferably, not more than 1%.

Further, according to a method of polishing to finish the surface of the dielectric of the dielectric-coated electrode, and the like, the surface roughness Rmax (JIS B 0601) of the electrode is made to be not more than 10 μm. Thereby, the gap between the thickness of the dielectric and the electrode can be kept constant, so that the discharged state can be stabilized. Moreover, distortion or crack according to thermal shrinkage or residual stress can be eliminated, and durability can be improved greatly in high accuracy. It is preferable to perform the polishing to finish the surface of the dielectric at least to the side of the dielectric that contacts with a substrate.

Further, it is preferable to dispose the dielectric-coated electrodes of the present invention so as to be faced to each other, and to provide such electrodes of the present invention in a plasma discharge treatment apparatus such as a thin film forming apparatus for forming a thin film on a surface of a substrate by applying a high-frequency voltage over 100 kHz and electric power of not less than 1 W/cm$^2$ between the facing electrodes and discharging so as to make a reactive gas in a plasma state, and by exposing the substrate to the reactive gas in the plasma state.

In the present invention, the upper limit of the frequency of the high-frequency voltage applied between the electrodes is preferable to be not more than 150 MHz. Further, the lower limit of the frequency of the high-frequency voltage is preferable to be not less than 200 kHz, more preferably, not less than 800 kHz.

Further, the lower limit of the electric power supplied between the electrodes is preferable to be not less than 1.2 W/cm$^2$, and the upper limit thereof is preferable to be not more than 50 W/cm$^2$, more preferably, not more than 20 W/cm$^2$. In addition, the discharge area (/cm$^2$) is an area in a range such that discharge occurs in the electrodes. As in the present invention, in case of applying a voltage of high power having high frequency and high power density, the discharge area corresponds to the total area of the discharge surface of one electrode. The power density can be calculated by dividing the total electric power (W) supplied from a power source connected to the electrodes by the total area.

Further, in order to obtain a uniform film thickness particularly in a large area, the total electric power applied between a set of facing electrodes is preferable to be over 15 kW, more preferably, not less than 30 kW, and further preferably, not less than 50 kW. From the viewpoint of generation of heat, it is preferable to be not more than 300 kW. In addition, the total electric power corresponds to the electric power (W) supplied from the power source connected to the above-described set of electrodes. In case that two or more power sources are connected to the above-described set of electrodes, the total electric power is the added value of power supplied from all of the power sources.

Figure 1:
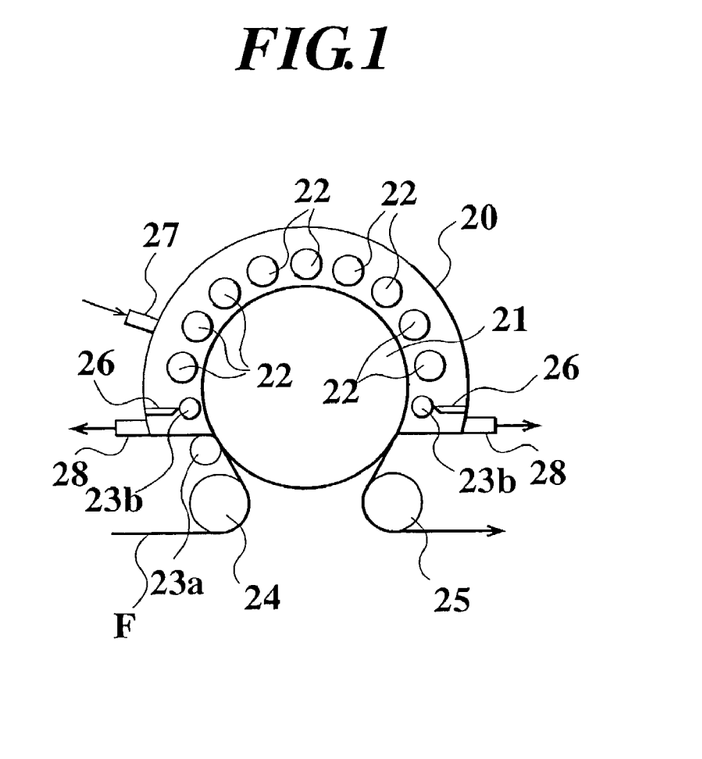
FIG. 1 is a view schematically showing an example of a plasma discharge treatment container provided in a plasma discharge treatment apparatus (thin film forming apparatus) of the present invention.

Concretely, in the later-described plasma discharge treatment apparatus in FIG. 6, the total electric power is the electric power supplied from the power source 50 connected to the roll electrode 21 and the prismatic electrode group 29, which are a set of facing electrodes. In addition, in FIG. 6, when the face of the prismatic electrodes 29 facing to the roll electrode 21 is made to be a discharge surface of the application electrode side, the total of the area of this discharge surface becomes discharge area. When the electrode is like the cylindrical electrodes 22 as shown in FIG. 1, the total of the projected area of the cylindrical electrodes 22 to the roll electrode 21 becomes discharge area.

Further, the high-frequency voltage applied between the electrodes may be an intermittent pulse wave or a continuous sine curve. In order to obtain the effects of the present invention, the sine curve is preferable.

The inventors has found that an equable and high-performance thin film which is precise and has high uniformity in film thickness can be obtained with high production efficiency by applying an electric field of high power as mentioned above to a large area. The inventors presume that this excellent effects are caused by making it possible to generate uniformly high-density plasma across a large area according to the above-described method for discharging in high power.

Next, a plasma discharge treatment apparatus in which such electrodes are used will be explained with reference to FIGS. 1 to 6. The plasma discharge treatment apparatus shown in FIGS. 1 to 6 is an apparatus for discharging between a roll electrode, which is an earth electrode, and a plurality of fixed electrodes, which are application electrodes, disposed in a position facing to the roll electrode; supplying a reactive gas between the above-mentioned electrodes so as to make the reactive gas in a plasma state; and forming a thin film on a long film-like substrate wound around the roll electrode by exposing the substrate to the reactive gas in the plasma state. Here, the length of the electrodes is the same as the length of the long film in a width direction, which is a direction orthogonal to the substrate conveyance direction. In case that the region to form the thin film is shorter than, being inside, the length of the width of the long film, on the assumption that the end portions of the long film in the width direction is cut out after the thin film is formed, the same length of discharge surface of the electrodes may be the same or more on the basis of the length of the region to form the thin film.

The plasma discharge treatment apparatus (for example, thin film forming apparatus or the like) of the present invention is not limited to the above. It may be the one for maintaining glow discharge stable and for exciting a reactive gas to a plasma state in order to form a thin film. However, the method for placing a substrate between electrodes and supplying a reactive gas between the electrodes as described above is preferable since it is possible to make the discharge area large, to make the film thickness uniform, and to form a high-performance thin film.

Figure 2:
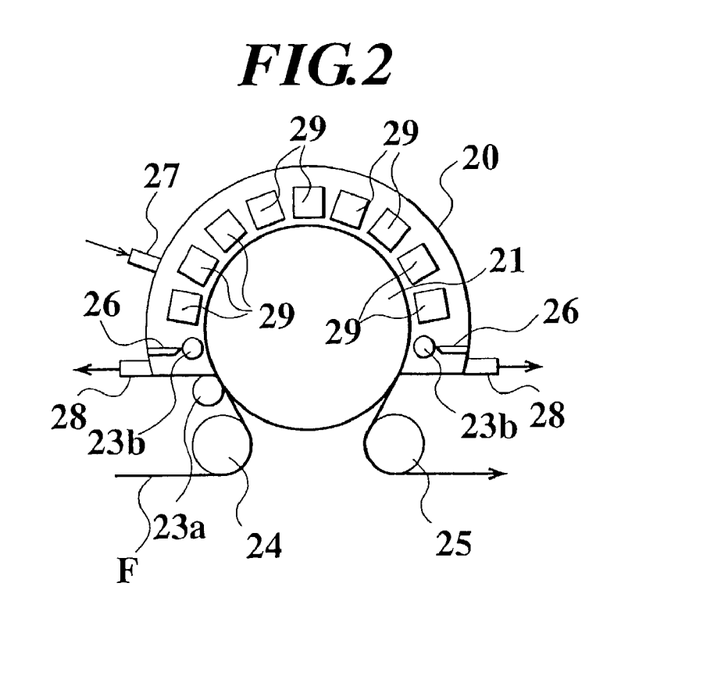
FIG. 2 is a view schematically showing another example of a plasma discharge treatment container.

FIG. 1 is a view schematically showing an example of a plasma discharge treatment container 20 in the plasma discharge treatment apparatus 10 of the present invention. In the embodiment, the plasma discharge treatment container 20 shown in FIG. 2 is used.

In FIG. 1, a long film-like substrate F is conveyed by being wound around a roll electrode 21 rotating in the conveyance direction (clockwise in the figure). The fixed electrodes 22 are a plurality of cylinders, and are disposed so as to be faced to the roll electrode 21. The substrate F wound around the roll electrode 21 is pressed against nip rollers 23a and 23b and controlled by a guide roller 24. Then, the substrate F is conveyed into a discharge treatment space secured by the plasma discharge treatment container 20, and discharge plasma treatment is performed. Then, the substrate F is conveyed to the next process via a guide roller 25. Further, dividers 26 are disposed in the vicinity of the nip rollers 23b, respectively, and inhibit air accompanied with the substrate F from going into the plasma discharge treatment container 20.

It is preferable to suppress the accompanied air to not more than 1 volume % out of the whole volume of gas in the plasma discharge treatment container 20, and more preferably, not more than 0.1 volume %. It can be achieved according to the nip roller 23b.

In addition, the mixed gas (discharge gas and reactive gas) used in discharge plasma treatment is supplied into the plasma discharge treatment container 20 from an air supply opening 27, and the gas after treatment is exhausted from an exhaust opening 28.

FIG. 2 is a view schematically showing another example of a plasma discharge treatment container 20 as mentioned above. Cylindrical fixed electrodes 22 are used in the plasma discharge treatment container 20 in FIG. 1, on the other hand, prismatic electrodes 29 are used in the plasma discharge treatment container 20 in FIG. 2.

The prismatic electrodes 29 shown in FIG. 2 are preferably used in forming a thin film compared with the cylindrical electrodes 22 shown in FIG. 1 since they have an effect of broadening the discharge range (discharge area).

Figure 3:
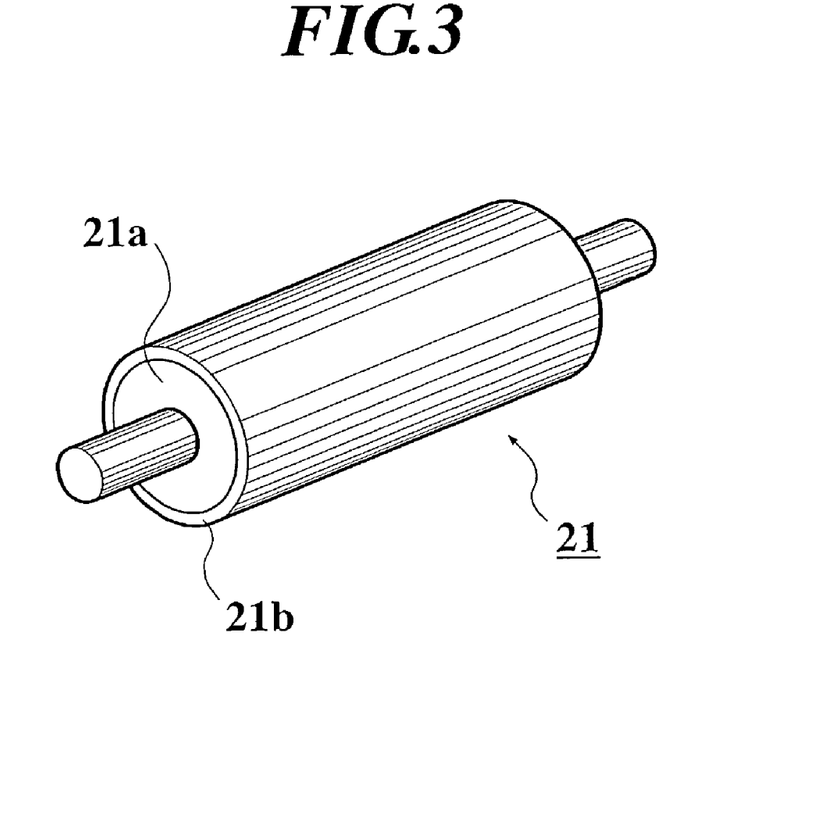
FIG. 3 is a perspective view showing an example of a cylindrical roll electrode.
Figure 4:
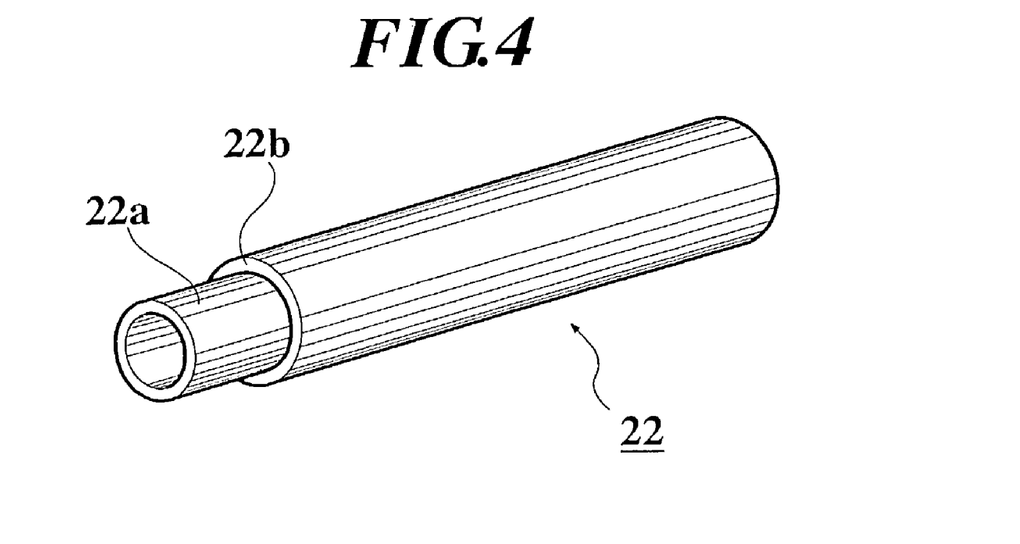
FIG. 4 is a perspective view showing an example of a fixed-type cylindrical electrode.
Figure 5:
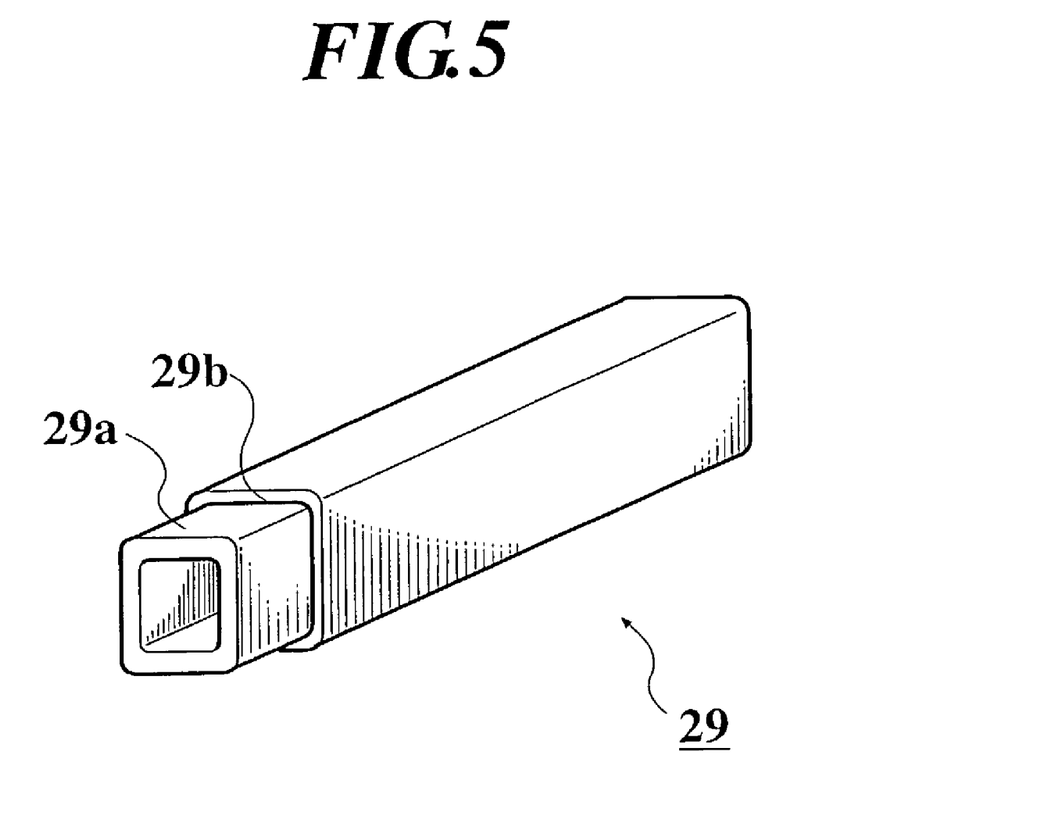
FIG. 5 is a perspective view showing an example of a fixed-type prismatic electrode.

FIG. 3 is a view schematically showing an example of the above-mentioned cylindrical roll electrode 21. FIG. 4 is a view schematically showing an example of a cylindrical fixed electrode 22. FIG. 5 is a view showing an example of a prismatic fixed electrode 29.

In FIG. 3, the roll electrode 21, which is an earth electrode, is a combination of a conductive base material 21a and a ceramics coating treatment dielectric 21b. That is, the ceramics coating treatment dielectric 21b as a dielectric coating layer, in which sealing is performed by using a sealing material of inorganic compound after ceramics is sprayed, is coated to the conductive base material 21a, such as metal or the like. The ceramics coating treatment dielectric 21b having film thickness of 1 mm is coated to the outside of the roll electrode 21 and grounded to earth. Further, as ceramics material used for spraying, alumina, silicone nitride or the like is preferably used, however, alumina is further preferable because of its easiness in processing.

As the conductive base material 21a, such as metal or the like, metal such as titanium, silver, platinum, stainless, aluminum, iron or the like, a composite material of iron and ceramics, or a composite material of aluminum and ceramics is given. However, stainless is preferable from the viewpoint of processing.

In addition, in the embodiment, as for the base material of the roll electrode, a jacket roll base material made of stainless having a cooling member according to cooling water is used (not shown in the figure).

FIGS. 4 and 5 are fixed electrodes 22 and 29, which are application electrodes, and are the same combination as the above-described roll electrode 21. That is, the same dielectrics 22b and 29b as the above are coated to hollow stainless pipes 22a and 29a as conductive base materials, respectively, so that cooling according to cooling water can be performed during the discharge.

As the power source for applying a voltage to application electrodes, it is not limited, however, a high-frequency power source (200 kHz) produced by Pearl Kogyo Co., Ltd., a high-frequency power source (800 kHz) produced by Pearl Kogyo Co., Ltd., a high-frequency power source (13.56 MHz) produced by JEOL, Ltd., a high-frequency power source (150 MHz) produced by Pearl Kogyo Co., Ltd., or the like can be used.

Figure 6:
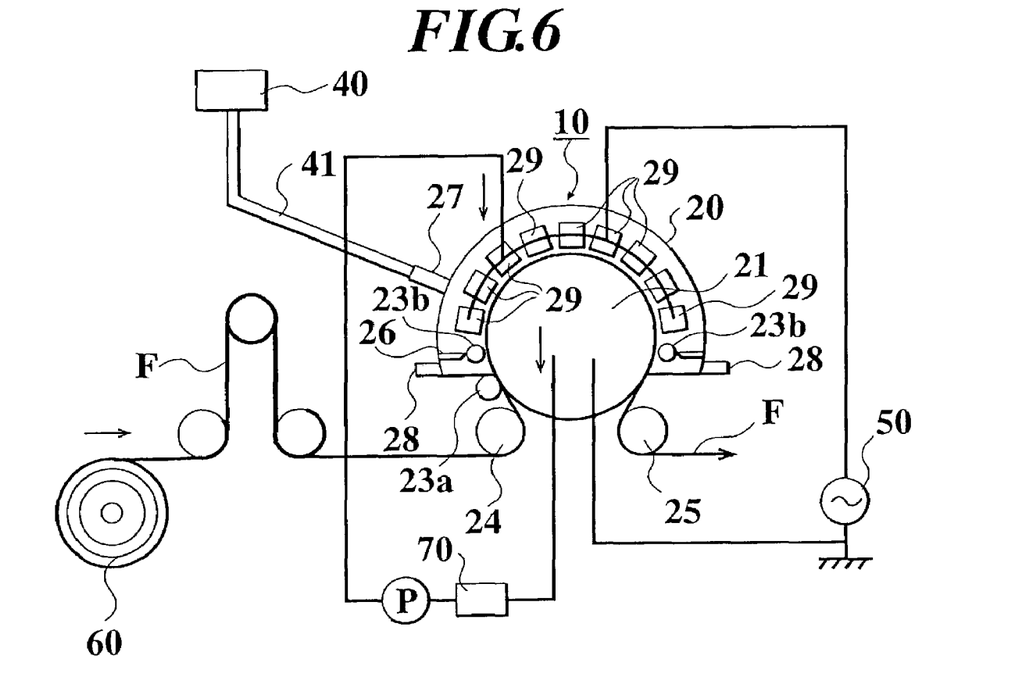
FIG. 6 is a view schematically showing an example of a plasma discharge treatment apparatus.

FIG. 6 is a view schematically showing an example of the plasma discharge treatment apparatus 10 of the present invention.

In FIG. 6, the portion corresponding to the plasma discharge treatment container 20 is the same as that in FIG. 2. However, the apparatus further comprises a gas generator 40, a power source 50, an electrode cooling unit 70 and the like. As a coolant of the electrode cooling unit 70, an insulative material such as distilled water, oil or the like is used.

The electrodes 21 and 29 shown in FIG. 6 are the same as those shown in FIGS. 3, 4, 5 and the like, and the gap between the facing electrodes is set to, for example, approximately 1 mm.

The distance between the above-described electrodes is determined in consideration of thickness of the solid dielectric provided on the conductive base material of the electrodes, amount of the applied voltage, purpose of utilizing plasma, and the like. As for the shortest distance between the solid dielectric and the electrode(s) when the solid dielectric is provided on one of the above-described electrodes, or as for the distance between two solid dielectrics when the solid dielectrics are provided on both of the above-described electrodes, it is preferable to be between 0.5 mm and 20 mm from the viewpoint of performing uniform discharge, and more preferably, 1 mm±0.5 mm, in both cases.

The roll electrode 21 and the fixed electrodes 29 are disposed in predetermined positions in the plasma discharge treatment container 20. Then, the flow rate of the mixed gas generated by the gas generator 40 as a gas supply member is controlled, and the mixed gas is put into the plasma discharge treatment container 20 by the air supply opening 27 via a gas charging member 41. Thus, the mixed gas used for plasma treatment is charged in the plasma discharge treatment container 20 and then exhausted by the exhaust opening 28. Next, a voltage is applied to the electrodes 21 and 29 by the power source 50, and the roll electrode 21 is grounded to earth so as to generate discharge plasma. Here, a substrate F is supplied from a roll-like original winding substrate 60, and conveyed between the electrodes in the plasma discharge treatment container 20 via the guide roller 24 in a single-side contacting (contacting to the roll electrode 21) state. Then, a film is formed on the surface of the substrate F by discharge plasma during the conveyance (CVD). Thereafter, the substrate F is conveyed to the next process via the guide roller 25. Here, the film is formed only on the surface of the substrate F not contacting to the roll electrode 21.

The value of the voltage applied to the fixed electrodes 29 by the power source 50 is determined appropriately. For example, the voltage is adjusted approximately between 10 V and 10 kV, and the power source frequency is adjusted between over 100 kHz and not more than 150 MHz. Here, with respect to application method of the power source, either a continuous sine curve-like continuous oscillation mode, which is called a continuous mode, and an intermittent oscillation mode for intermittently performing ON/OFF, which is called a pulse mode, may be employed. However, a more precise and high-quality film can be obtained by employing the continuous mode.

As for the plasma discharge treatment container 20, a treatment container made of Pyrex (R) glass or the like is preferably used. However, a container made of metal can be used if it can be insulated from the electrodes. For example, a polyimide resin or the like may be attached on the inner surface of a flame of aluminum or stainless, or ceramics spraying may be performed to the metal frame so as to be insulated.

Further, when the substrate F is made of resin, it is preferable to adjust the temperature of the substrate at the time of discharge plasma treatment to a temperature between ordinary temperature (15° C. to 25° C.) and less than 200° C., more preferably, between ordinary temperature and 100° C., in order to minimize the effects on the substrate F at the time of discharge plasma treatment. In order to adjust the temperature in the above-described temperature range, discharge plasma treatment is performed by cooling the electrodes and the substrate with a cooling member as appropriate.

In the present invention, the above-described discharge plasma treatment is performed under atmospheric pressure or a pressure in the vicinity of atmospheric pressure. Here, "a pressure in the vicinity of atmospheric pressure" means a pressure between 20 kPa and 110 kPa. In order to preferably obtain the effects described in the present invention, it is preferable to be between 93 kPa and 104 kPa.

Further, in the dielectric-coated electrode of the present invention, it is preferable to adjust the electrode so that the maximum of the surface roughness (Rmax) regulated in JIS B 0601 of at least the surface of the electrode that contacts with the substrate F will become not more than 10 µm, from the viewpoint of obtaining the effects described in the present invention. More preferably, the electrode is adjusted so that the maximum value of the surface roughness will become not more than 8 µm, and further preferably, not more than 7 µm. In order to obtain an Rmax within such a range, it is preferable to perform polishing on the surface.

Further, the center-line average surface roughness (Ra) regulated by JIS B 0601 is preferable to be not more than 0.5 µm, and more preferably, not more than 0.1 µm.

Figure 7:
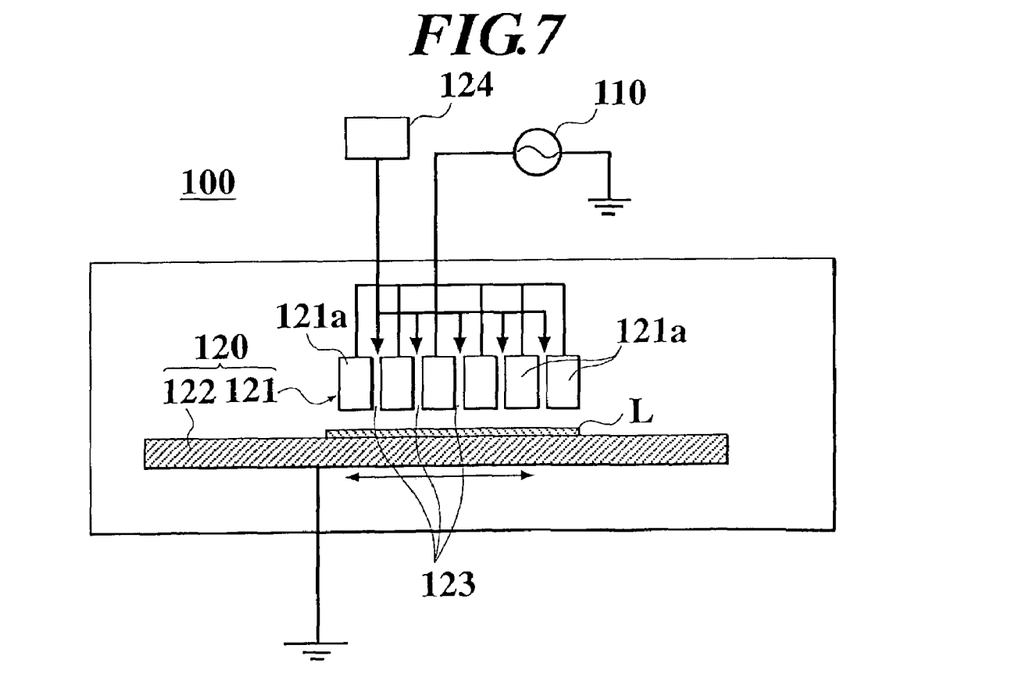
FIG. 7 is a view schematically showing another example of a plasma discharge treatment apparatus.

In addition, the above-mentioned plasma discharge treatment apparatus 10 shown in FIGS. 1 to 6 is an apparatus used in the case that the substrate F can be bended as a film or the like. However, if it is the case of using a substrate L having a certain thickness or a hard substrate L, for example, glass, lens or the like, a plasma discharge treatment apparatus 100 as shown in FIG. 7 is used. FIG. 7 is a view schematically showing another example of the plasma discharge treatment apparatus.

The plasma discharge treatment apparatus (thin film forming apparatus) 100 comprises a power source 110, electrodes 120 and the like. The electrodes 120 comprise an upper flat plate electrode 121 and a lower flat plate electrode 122. The upper flat plate electrode 121 and the lower flat plate electrode 122 are disposed so as to be faced up and down.

The upper flat plate electrode 121 comprises a plurality of generally rectangular flat electrodes 121a, . . . , which are disposed so as to be faced from side to side. Between these electrodes 121a, . . . , are gas passage sections 123, . . . , respectively. That is, a gas supply section 124 as gas supply member is provided in the above of the upper flat plate electrode 121, and a reactive gas or discharge gas is supplied respectively into the gas passage sections 123 from the gas supply section 124. Then, the gas is blown between the upper flat plate electrode 121 and the lower flat plate electrode 122.

The lower flat plate electrode 122 is grounded to earth. The electrode 122 sets a substrate L on the surface thereof, and make the substrate L move back and forth in the back-and-forth direction to the gas passage sections 123. Therefore, a plasma state is obtained between the upper flat plate electrode 121 and the lower flat plate electrode 122 and a film is formed on the substrate L by moving the substrate L according to the lower flat plate electrode 122.

Next, the gases used in the plasma discharge treatment apparatus of the present invention will be explained.

The gases used in the present invention are different in accordance with the kinds of thin films to be provided on a substrate. However, basically, they are a discharge gas and a reactive gas to form a thin film. The reactive gas is preferable to be included 0.01 volume % to 10 volume % out of the whole gas amount supplied in the discharge space. As for the film thickness of a thin film, a thin film in a rage of 0.1 nm to 1000 nm is obtained.

As for the above-described discharge gas, an eighteenth group element in the periodic table, concretely, helium, neon, argon, krypton, xenon, radon, nitrogen or the like, is given. However, helium, argon or nitrogen is used preferably. The discharge gas is preferable to be included not less than 90 volume % out of the total amount of 100 volume % of the discharge gas and the reactive gas.

The reactive gas becomes in a plasma state in the discharge space and contains a component for forming a thin film, such as organometallic compound, organic compound, inorganic compound or the like.

For example, a gas including at least one of an organometallic compound selected from zinc acetylacetonato, triethylindium, trimethylindium, diethylzinc, dimethylzinc, etraethyltin, etramethyltin, di-n-butyltin diacetate, tetrabutyltin, tetraoctyltin and the like is used as the reactive gas. Thereby, a metal oxide layer useful as a middle refractive index layer of conductive film, antistatic film or antireflection film can be formed.

Further, by using a compound gas containing fluorine as the reactive gas, a fluorine-containing group is formed on the surface of the substrate to and the surface energy is made to be low, and a water-repellent film having a water-repellent surface can be obtained. As a compound containing fluorine element, fluorine or carbon compound such as hexafluoropropylene ($CF_3CFCF_2$), octafluorocycrobutane ($C_4F_8$) or the like is given. From the viewpoint of safety, hexafluoropropylene and octafluorocycrobutane that do not generate hydrogen fluoride, which is a harmful gas, can be used.

Further, a hydrophilic polymerized film can be piled by performing treatment under an atmosphere of monomer having a haydrophilic group and polymerizable unsaturated bond in the molecule thereof. As the above-described hydrophilic group, hydroxy group, sulfonate group, sulfonate base, primary, secondary or tertiary amino group, amide group, quarternary ammonium base, carboxylate group, calboxylate base or the like is given. Besides, it is possible to pile a hydrophilic polymerized film similarly also by using a monomer having polyethylene glycol chain.

As the above-described monomer, acrylic acid, methacrylic acid, acrylic amide, methacrylic amide, N,N-dimethylacrylic amide, sodium acrylate, sodium methacrylate, potassium acrylate, potassium methacrylate, sodium styrenesulfonate, allyl alcohol, allyl amine, polyethylene glycol methacrylic ester, polyethylene glycol diacrylic ester or the like is given, and at least one kind of these can be used.

Further, a low refractive index layer or high refractive index layer of an antireflection film can be provided by using a reactive gas containing an organofluorine compound, silicon compound or titanium compound.

As an organofluorine compound, fluorocarbon gas, fluorohydrocarbon gas or the like is preferably used. As the fluorocarbon gas, tetrafluorocarbon or hexafluorocarbon, concretely, tetrafluoroethane, tetrafluoroethylene, hexafluoropropylene, octafluorocycrobutane or the like is given. As the above-described fluorohydrocarbon gas, difluoromethane, tetrafluoroethane, tetrafluoropropylene, trifluoropropylene or the like is given.

Moreover, a halide of fluorohydrocarbon compounds such as 1-chloro-3-fluoromethane, 1-chloro-2-fluoromethane, 2-chloro-4-fluorocycrobutane and the like, a fluorine substitution products of organic compounds such as alcohol, acid, ketone and the like can be used. However, it is not limited to these. Further, these compounds may have an ethyleny unsaturated group in the molecule. The above-described compounds may be used independently or by being mixed.

In case of using the above-described organofluorine compound in a mixed gas, the content of the organofluorine compound is preferable to be between 0.1 volume % and 10 volume %, more preferably, between 0.1 volume % and 5 volume % from the viewpoint of forming a uniform thin film on a substrate by discharge plasma treatment.

Further, in case that the organofluorine compound is a gas at ordinary temperature and ordinary pressure, it can be used as it is as a component in a mixed gas. However, in case that the organofluorine compound is liquid or solid at ordinary temperature and ordinary pressure, it may be used by being vaporized according to a method such as heating, reducing pressure or the like, or it may be used by being dissolved in an appropriate solvent.

In case of using the above-described titanium compound in a mixed gas, the content of the titanium compound is preferable to be between 0.01 volume % and 10 volume %, more preferably, between 0.01 volume % and 5 volume % from the viewpoint of forming a uniform thin film on a substrate by discharge plasma treatment.

Further, it is possible to use hydrogenated metal compound, halogenated metal compound, hydrated metal compound, hyperoxidated metal compound or the like as a reactive gas. These may be used by being vaporized appropriately.

Further, the hardness of a thin film can be improved extremely by making 0.1 volume % to 10 volume % of a hydrogen gas be contained in the above-described mixed gas.

Further, the reaction can be promoted and a precise and high-quality thin film can be formed by making 0.01 volume % to 5 volume % of a component selected from oxygen, ozone, hydrogen peroxide, carbon dioxide, carbon monoxide, hydrogen and nitrogen be contained in the mixed gas.

As the above-described silicon compound and titanium compound, metal hydrogen compound and metalalkoxide are preferable from the viewpoint of handling. Particularly, the metalalkoxide is preferably used since it does not have corrosiveness, does not generate harmful gas, and also since there is little soil in process.

Further, in order to supply the above-described silicon compound or titanium compound between the electrodes, which is the dielectric space, it may be in any state of gas, liquid or solid at ordinary temperature and ordinary pressure. In case of gas, it can be supplied as it is in the discharge space. However, in case of liquid or solid, it is used by being vaporized according to a method such as heating, reducing pressure, irradiating ultrasonic wave or the like. In case of using a silicon compound or titanium compound by vaporizing it according to heating, a metalalkoxide, which is liquid at ordinary temperature and the boiling point is not more than 200° C., such as tetraethoxysilane, tetraisopropoxytitanium or the like is suitably used to form an antireflection film. The above-described metalalkoxide may be used by diluting with a solvent. As for the solvent, an organic solvent such as methanol, ethanol, n-hexane or the like, and the mixed solvent of these can be used. In addition, the effects of these diluted solvents in forming of a thin film on a substrate, composition of the thin film and the like can be ignored since they are decomposed in a molecule or atom during plasma discharge treatment.

As the above-described silicon compound, for example, an organometallic compound such as dimethylsilane, tetramethylsilane or the like; metal hydrogen compound such as monosilane, disilane or the like; metal halogen compound such as dichlorosilane, trichlorosilane or the like; alkoxysilane such as tetramethoxysilane, tetraethoxysilane, dimethyldiethoxysilane or the like; organosilane or the like is preferably used. However, it is not limited to these. Further, these can be used by being combined appropriately.

In case of using the above-described silicon compound in the gas, the content of the silicon compound is preferable to be between 0.1 volume % and 10 volume %, more preferably, between 0.1 volume % and 5 volume % from the viewpoint of forming a uniform thin film on a substrate by discharge plasma treatment.

As the above-described titanium compound, an organometallic compound such as tetradimethylaminotitanium or the like; metal hydrogen compound such as monotitanium, dititanium or the like; metal halogen compound such as titanium dichloride, titanium trichloride, titanium tetrachloride or the like; metalalkoxide such as tetraethoxytitanium, tetraisopropoxytitanium, tetrabutoxytitanium or the like; or the like is preferably used. However, it is not limited to these.

In case of adding an organometallic compound in a reactive gas, for example, it is possible to include metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu. More preferably, these organometallic compounds are selected from metalalkoxide, alkylated metal and metal complex.

Various high-functional thin films can be obtained by selecting appropriately the above-described reactive gases or the reactive gases other than the above. Examples are shown bellow, however, the present invention is not limited to this.

Electrode membrane: Au, Al, Ag, Ti, Pt, Mo, Mo—Si
Dielectric protective film: $SiO_2$, SiO, $Si_3N_4$, $Al_2O_3$, $Y_2O_3$
Transparent conductive film: $In_2O_3$, $SnO_2$
Electrochromic film: $WO_3$, $IrO_2$, $MoO_3$, $V_2O_5$
Fluorescent screen: ZnS, ZnS+ZnSe, ZnS+CdS
Magnetic storage film: Fe—Ni, Fe—Si—Al, $\gamma$-$Fe_2O_3$, Co, $Fe_3O_4$, Cr, $SiO_2$, $AlO_3$
Superconductive film: Nb, Nb—Ge, NbN
Solar battery film: a-Si, Si
Reflection film: Ag, Al, Au, Cu
Selective absorbing film: ZrC—Zr
Permselective membrane: $In_2O_3$, $SnO_2$
Antireflection film: $SiO_2$, $TiO_2$, $SnO_2$
Shadow mask: Cr
Abrasion-resistant film: Cr, Ta, Pt, TiC, TiN
Corrosive-resistant film: Al, Zn, Cd, Ta, Ti, Cr Heat-resistant film: W, Ta, Ti
Lubricating film: $MoS_2$
Decoration film: Cr, Al, Ag, Au, TiC, Cu Next, the substrate capable of being used in the present invention will be explained.

As for the substrate capable of being used in the present invention, it is not limited particularly if it is possible to form a thin film on its surface, such as those having a shape of film-like, lens-like or the like. A thin film may be formed by placing the substrate between the electrodes if it can be placed between the electrodes, and by spraying the generated plasma on the substrate if it cannot be placed between the electrodes.

The material of the substrate is also not limited particularly. However, a resin can be used preferably since it is a process under atmospheric pressure or under a pressure in the vicinity of atmospheric pressure and since it is glow discharge at low temperature.

As a substrate, preferably, cellulose ester such as cellulose triacetate or the like, polyester, polycarbonate, polystyrene, and moreover, the one such that gelatine, polyvinyl alcohol (PVA), acrylic resin, polyester resin, cellulosic resin or the like is applied on these can be used.

As the above-described substrate, concretely, polyester film, polyethylene film and polypropylene film, such as polyethylene terephthalate, polyethylene naphthalate or the like, cellulose esters, such as cellophane, cellulose diacetate film, cellulose acetate butyrate film, cellulose acetate propionate film, cellulose acetate phthalate film, cellulose triacetate, cellulose nitrate or the like, or a film made from their dielectrics, polyvinylidene chloride film, polyvinyl alcohol film, ethylene vinyl alcohol film, syndiotactic polystyrene system film, polycarbonate film, norbornene resin system film, polymethylpentene film, polyetherketone film, polyimide film, polyethersulfone film, polysulfone system film, polyetherketoneimide film, polyamide film, fluororesin film, nylon film, polymethyl methacrylate film, acryl film, polyarylate system film or the like can be given.

These materials can be used solely or by being mixed appropriately. Among these, cellulose triacetate (TAC) is preferably used. Further, a marketed production such as ZEONOR (produced by Zeon Corporation), ARTON (produced by JSR Corporation) or the like containing a norbornene system resin (amorphus cyclopolyolefin resin) which is well-known in the Japanese Patent Laid-Open Publications Nos. 3-14882, 3-122137 and the like, can be used preferably. As for the norbornene system resin, concretely, ring-opened polymer of norbornene system monomer, its hydrogenated product, addition type polymer of norbornene system monomer, addition type polymer of norbornene system monomer (disclosed in the above-described Publications, the Japanese Patent Laid-Open Publications Nos. 2-227424, 2-276842) and olefin, or the like is given. A well-known method may be used in polymerization of norbornene system monomer. A thermoplastic norbornene system resin hydrogenated product, concretely, the above-described ZEONOR, ARTON or the like, can be obtained by hydrogenating as appropriate.

Moreover, even though it is a material having large intrinsic birefringence such as polycarbonate, polyarylate, polysulfone, polyethersulfone (PES) (for example, Sumilite FS-1300 produced by Sumitomo Bakelite Co., Ltd.) or the like, it can be obtained by appropriately setting the conditions of solution casting, melt extrusion and the like, and moreover, the drawing condition in longitudinal and transversal directions, and the like.

Further, an organic-inorganic hybrid substrate can be used as a substrate. The organic-inorganic hybrid substrate is a substrate obtained by performing hydrolysis polycondensation of a monomer having a hydrogen bond acceptor or a polymerizable monomer and a reactive metal compound such as metalalkoxide or the like.

As a polymer, polyvinyl alcohol, polyvinyl chloride, polyvinylpyrrolidone, polyimide, polyamide, polycarbonate, polyurea, polyester, polyurethane, poly (2-methyl-2-oxazoline), polyacrylamide, poly (N-isopropyl acrylamide), poly (dimethylacrylamide), polyetherimide, cellulose ester or the like is given. Among these, cellulose ester is preferable.

As a polymerized polymer, isoprene, 1,3-butadiene, p-cyanostyrene, p-methoxystyrene, methacrylonitrile, p-chlorostyrene, styrene, α-methylstyrene, methyl methacrylate, methyl vinyl ketone, acrylonitrile, methylacrylate, vinyl acetate, ethylene, isobutene, vinylidene chloride, vinyl chloride, isobutylether, dimethylacrylamide or the like is given.

As the above-described metalalkoxide, alkoxide whose metal species is silicon, zirconium, titanium, germanium or the like is given. Among these, alkoxide of silicon or titanium is preferable.

As for a concrete production method, it can be synthesized with reference to the Japanese Patent Laid-Open Publication No. 2000-122038.

The film thickness of these films is preferable to be between 10 μm and 1000 μm.

As described above, a thin film can be formed on a substrate by executing atmospheric pressure plasma treatment according to a plasma discharge treatment apparatus.

EXAMPLES

Hereinafter, the present invention will be explained in detail according to Examples. However, the present invention is not limited to these Examples.

Example 1 of the Present Invention

Preparation of a Set of Dielectric-coated Electrodes A

A set of a roll electrode coated with dielectric and a plurality of prismatic application electrodes in the plasma discharge treatment apparatus in which the above-mentioned plasma discharge treatment container 20 in FIG. 2 was prepared as follows.

As for the roll electrode 21, a high-density and high-adhesive alumina thermal-sprayed coating was coated by the atmospheric plasma method to a jacket roll base material made of stainless having a cooling member according to cooling water (the cooling member is not shown in FIG. 2) so that the roll diameter of the roll electrode 21 would be 1000 mmφ. Thereafter, solution such that tetramethoxysilane was diluted by ethyl acetate was applied to the base material coated with alumina thermal-sprayed coating and dried. Then, the dried solution was hardened by ultraviolet irradiation, and sealing was performed.

The surface of the dielectric coated in this manner was polished so as to make the surface flat and smooth, and the dielectric was processed so that the Rmax would be 5 μm.

Figure 8:
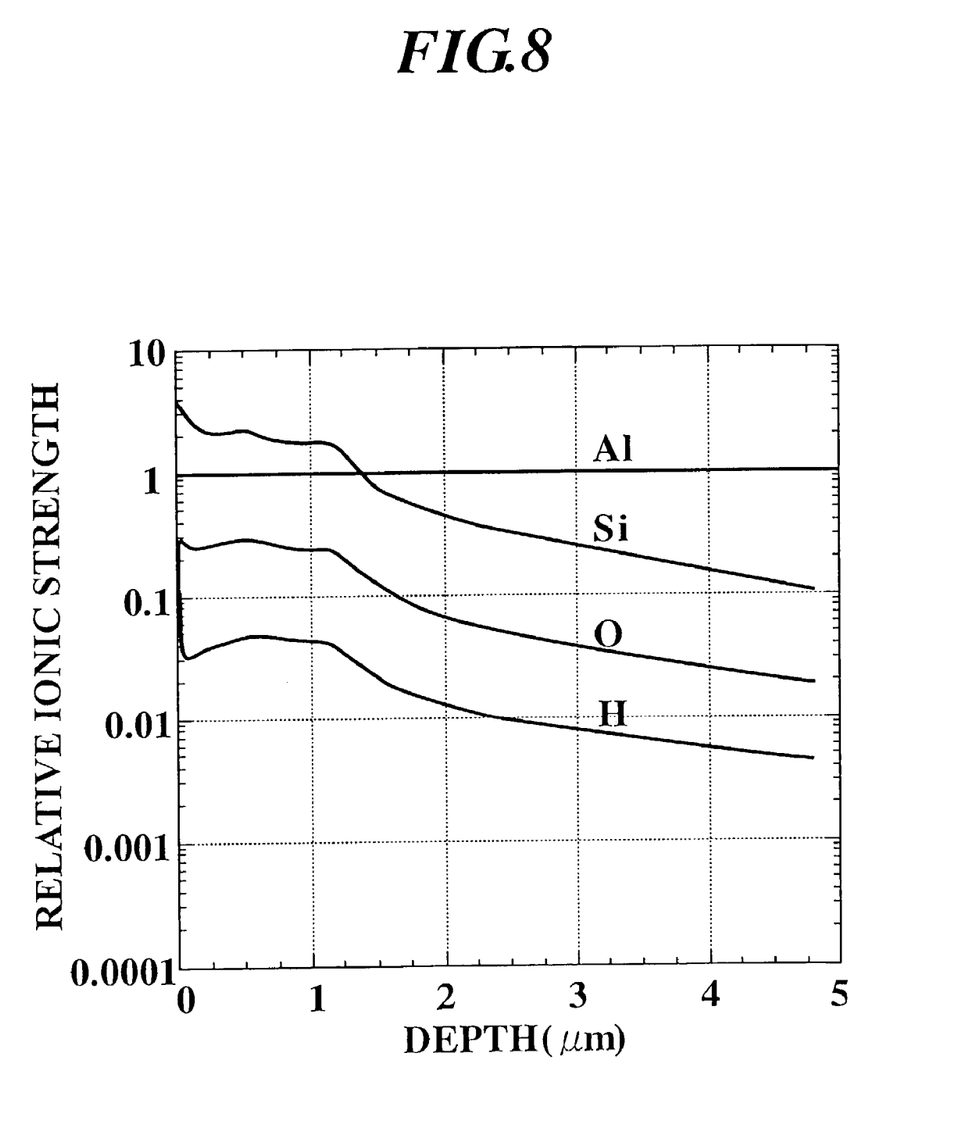
FIG. 8 is a graph showing analysis results of ionic strength ratio of a first metal atom and second metal atom in a depth direction of a dielectric in Example 1 of the present invention according to a dynamic SIMS measurement.

Then, analysis (measurement of ionic strength of Si and Al) in the depth direction of the dielectric-coated electrode was performed to the prepared dielectric-coated electrode according to the dynamic SIMS measurement. The result is shown in FIG. 8. In FIG. 8, the abscissa axis represents the depth (μm) from the most surface of the dielectric-coated electrode, and the ordinate axis represents the ionic strength of each substance contained in the dielectric.

The measurement conditions of the dynamic SIMS in the Example 1 were as follows:
Primary ion: $O_2^+$
Acceleration voltage: 5 kV
Primary ion electric current: 300 nA
Primary ion irradiation area: 300 μm square
Uptake area: 9% of irradiation area In addition, the measurement conditions of Al were as follows:
Detected strength of Al: since the detected strength of Al ion is high and the detector becomes saturated, the FAP (Field Axis Potential) was adjusted so that the detected strength of Al would become 1/10. In this embodiment, as for Al, it was measured as FAP–offset=5 V.
Detection peak: the measurement peak of Al was 27 a.m.u, and that of Si was 30 a.m.u.
Polarity of detection peak: positive ion was measured.

According to FIG. 8, it was confirmed that the ionic strength of Si was larger than the ionic strength of Al from the most surface to the depth of approximately 1.38 μm of the dielectric, and that the ionic strength of Al was larger than the ionic strength of Si from the depth of approximately 1.38 μm to the surface of the conductive base material.

Further, the ultimate void fraction of the dielectric in the prepared dielectric-coated electrode was 5 volume %, and the content of $SiO_x$ of the dielectric layer in this case was 75 mol %. The ultimate film thickness of the dielectric was 1 mm (the variation of film thickness being within±1%). Further, the dielectric constant of the dielectric was 10. The difference of the linear thermal expansion coefficient between the conductive base material and the dielectric was $9.8 \times 10^{-6}/°$ C. The roll electrode 21 was prepared in the above-mentioned manner, and grounded.

On the other hand, as for application electrodes, the same dielectric as the above was coated to a hollow square pure titanium pipe in the same conditions, and a facing electrode group was prepared. The physicality of the dielectric of the application electrodes was the same as that of the above-described roll electrode 21. However, the difference of the linear thermal expansion coefficient between the conductive base material and the dielectric was $1.7 \times 10^{-6}/°$ C. The total discharge area of the application electrodes was 150 cm (length in the width direction)×2 cm (length in the conveyance direction)×50 (number of the application electrodes) =15000 cm².

The heat-resistant temperature of a set of facing electrodes A prepared in this manner was 200° C., the withstand voltage thereof was not less than 10 kV, the critical power thereof was not less than 400 kW/m², and no breakdown was recognized at all even though it was discharged continuously for 240 hours.

Example 2 of the Present Invention

Preparation of a Set of Dielectric-coated Electrodes B

A set of dielectric-coated electrodes B was prepared in the same manner as the above-mentioned set of dielectric-coated electrodes A of the present invention except for changing the hollow square pure titanium pipe used for application electrodes in the set of dielectric-coated electrodes A to a stainless pipe. The Rmax of the surface of the dielectric, the ionic strength of Si and Al, content of $SiO_x$, the film thickness of the dielectric and the dielectric constant of the set of dielectric-coated electrodes B were the same as the set of dielectric-coated electrodes A except for the difference of the linear thermal expansion coefficient between the conductive base material and the dielectric of the application electrodes being $9.8 \times 10^{-6}/°$ C.

The heat-resistant temperature of the set of dielectric-coated electrodes B obtained in this manner was 120° C., the withstand voltage thereof was not less than 10 kV, the critical power thereof was not less than 400 kW/m², and no breakdown was recognized at all even though it was discharged continuously for 240 hours.

Comparative Example

Preparation of a Set of Dielectric-coated Electrodes

An alumina thermal-sprayed coating was coated to a conductive base material according to the atmospheric plasma method in the same manner as in the above-described set of dielectric-coated electrodes A of the present invention, and a set of dielectric-coated electrodes was prepared without performing sealing.

The heat-resistant temperature, the withstand voltage and the critical power of the set of dielectric-coated electrodes obtained in this manner had equivalent performance to the above-mentioned Examples of the present invention in the beginning, however, a spark occurred and the set of dielectric-coated electrodes was broken when it was operated continuously for 24 hours.

Example 3 of the Present Invention

Preparation of Thin Film forming Apparatus and Formation of Thin Film

The set of dielectric-coated electrodes A of the present invention prepared in the above-described Example 1 was provided in the plasma discharge treatment apparatus (thin film forming apparatus) 10 in FIG. 6. Further, as for the power source, a high-frequency power source (13.56 MHz) produced by JEOL, Ltd., was used.

A thin film was formed continuously according to the following conditions by using a long resin film as a substrate, and a high-quality titanium oxide film having a refractive index of 2.3 was obtained.
Discharge condition: discharge output 1.2 W/cm²
Discharge gas: argon 98.75 volume %
Reactive gas 1: hydrogen gas: 1 volume % out of the whole amount of gas
Reactive gas 2: tetraisopropoxy titanium steam (bubbling an argon gas to liquid heated to 150° C.): 0.25 volume % out of the whole amount of gas In the above, the embodiment and Examples of the present invention is explained. However, it is needless to say that the present invention is not limited to such embodiment or Examples, but various modifications are possible in a range within the scope of the present invention.

For example, in the embodiment and Examples of the present invention, the plasma discharge treatment apparatus is used to form a thin film on the surface of a substrate. However, the present invention is not limited to this. It can be also applied to various surface treatments and the like of a substrate.

According to the present invention, as for the ionic strength of the first metal atom and the ionic strength of the second metal atom according to the dynamic SIMS, the ionic strength of the second metal atom is large from the most surface to a predetermined depth of the dielectric, and the ionic strength of the first metal atom is large from the predetermined depth to the surface of the conductive base material. Therefore, the voids in the most surface of the dielectric are filled with the second metal atom, so that dielectric breakdown can be prevented even though it is the case that large electric power (a high-frequency voltage over 100 kHz and electric power not less than 1 W/cm$^2$) is supplied between the facing electrodes. Thereby, it is possible to maintain a stable discharged state for a long term.

The entire disclosure of Japanese Patent Application No. 2002-170028 filed on Jun. 11, 2002 including specification, claims, drawings and summary are incorporated herein by reference in its entirety.

What is claimed is:

1. A dielectric-coated electrode comprising:
   a conductive base material coated with a dielectric on a surface thereof,
   the dielectric comprising:
   a first metal atom; and
   a second metal atom,
   wherein as for an ionic strength of the first metal atom and an ionic strength of the second metal atom according to a dynamic SIMS measurement, the ionic strength of the second metal atom is larger than the ionic strength of the first metal atom from the most surface of the dielectric toward a predetermined depth of the dielectric, and the ionic strength of the first metal atom is larger than the ionic strength of the second metal atom from the predetermined depth of the dielectric toward the surface of the conductive base material.

2. The electrode of claim 1, wherein the predetermined depth is not less than 1 μm.

3. The electrode of claim 2, wherein the ionic strength of the second metal atom to the ionic strength of the first metal atom decreases from the most surface of the dielectric toward the predetermined depth of the dielectric.

4. The electrode of claim 1, wherein the first metal atom is Al, and the second metal atom is Si.

5. The electrode of claim 1, wherein the electrode is obtained by spraying a material containing the first metal atom onto the base material, and thereafter, sealing the material containing the first metal atom with a material containing the second metal atom.

6. The electrode of claim 5, wherein the material containing the first metal atom is alumina.

7. The electrode of claim 5, wherein the sealing is for applying the material containing the second metal atom to the surface of the sprayed electrode, and hardening the material containing the second metal atom according to sol-gel reaction.

8. The electrode of claim 7, wherein the hardened material containing the second metal atom is silicon oxide.

9. The electrode of claim 1, wherein a void fraction of the dielectric is not more than 10 volume %.

10. The electrode of claim 1, wherein a difference of a linear thermal expansion coefficient between the dielectric and the base material is not more than $10 \times 10^{-6}$/° C.

11. The electrode of claim 1, wherein a heat resistant temperature of the electrode is not less than 100° C.

12. A plasma discharge treatment apparatus comprising:
    facing electrodes;
    a gas supply member for supplying a reactive gas between the facing electrodes; and
    a power source for applying a high-frequency voltage between the facing electrodes,
    wherein at least one of the facing electrodes is the electrode of claim 1.

13. The apparatus of claim 12, wherein each of the facing electrodes is the electrode of claim 1.

14. A plasma discharge treatment apparatus comprising:
    facing electrodes;
    a gas supply member for supplying a reactive gas between the facing electrodes; and
    a power source for applying a high-frequency voltage between the facing electrodes,
    wherein at least one of the facing electrodes is the electrode of claim 2.

15. A plasma discharge treatment apparatus comprising:
    facing electrodes;
    a gas supply member for supplying a reactive gas between the facing electrodes; and
    a power source for applying a high-frequency voltage between the facing electrodes,
    wherein at least one of the facing electrodes is the electrode of claim 3.

16. A plasma discharge treatment apparatus comprising:
    facing electrodes;
    a gas supply member for supplying a reactive gas between the facing electrodes; and
    a power source for applying a high-frequency voltage between the facing electrodes,
    wherein at least one of the facing electrodes is the electrode of claim 4.

17. A plasma discharge treatment apparatus comprising:
    facing electrodes;
    a gas supply member for supplying a reactive gas between the facing electrodes; and
    a power source for applying a high-frequency voltage between the facing electrodes,
    wherein at least one of the facing electrodes is the electrode of claim 5.

18. A plasma discharge treatment apparatus comprising:
    facing electrodes;
    a gas supply member for supplying a reactive gas between the facing electrodes; and
    a power source for applying a high-frequency voltage between the facing electrodes,
    wherein at least one of the facing electrodes is the electrode of claim 6.

19. A method for forming a thin film, comprising:
    supplying a reactive gas between facing electrodes;
    applying a high-frequency voltage between the facing electrodes under atmospheric pressure or under a pressure in a vicinity of the atmospheric pressure and discharging so as to make the reactive gas in a plasma state; and
    supplying a substrate between the facing electrodes and exposing the substrate to the reactive gas in the plasma state so as to form the thin film on a surface of the substrate,
    wherein at least one of the facing electrodes is the electrode of claim 1.

20. The method of claim 19, wherein each of the facing electrodes is the electrode of claim 1.

21. The dielectric-coated electrode of claim 1, wherein the maximum of the surface roughness (Rmax) of the dielectric-coated electrode is not more than 10 μm.

22. The dielectric-coated electrode of claim 1, wherein the center-line average surface roughness (Ra) of the dielectric-coated electrode is not more than 0.5 μm.

23. The plasma discharge treatment apparatus of claim 12, wherein the maximum of the surface roughness (Rmax) of the dielectric-coated electrode is not more than 10 μm.

24. The plasma discharge treatment apparatus of claim 12, wherein the center-line average surface roughness (Ra) of the dielectric-coated electrode is not more than 0.5 μm.

25. The plasma discharge treatment apparatus of claim 14, wherein the maximum of the surface roughness (Rmax) of the dielectric-coated electrode is not more than 10 μm.

26. The plasma discharge treatment apparatus of claim 14, wherein the center-line average surface roughness (Ra) of the dielectric-coated electrode is not more than 0.5 μm.

27. The plasma discharge treatment apparatus of claim 15, wherein the maximum of the surface roughness (Rmax) of the dielectric-coated electrode is not more than 10 μm.

28. The plasma discharge treatement apparatus of claim 15, wherein the center-line average surface roughness (Ra) of the dielectric-coated electrode is not more than 0.5 μm.

29. The plasma discharge treatment apparatus of claim 16, wherein the maximun of the surface rouglmess (Rmax) of the dielectric-coated electrode is not more than 10 μm.

30. The plasma discharge treatment apparatus of claim 16, wherein the center-line average surface roughness (Ra) of the dielectric-coated electrode is not more than 0.5 μm.

31. The plasma discharge treatment apparatus of claim 17, wherein the maximiun of the surface roughness (Rrnax) of the dielectric-coated electrode is not more than 10 μm.

32. The plasma discharge treatment apparatus of claim 17, wherein the center-line average surface roughness (Ra) of the dielectric-coated electrode is not more than 0.5 μm.

33. The plasma discharge treatment apparatus of claim 18, wherein the maximum of the surface roughness (Rmax) of the dielectric-coated electrode is not more than 10 μm.

34. The plasma discharge treatment apparatus of claim 18, wherein the center-line average surface roughness (Ra) of the dielectric-coated electrode is not more than 0.5 μm.

* * * * *